United States Patent
Riel et al.

(10) Patent No.: US 9,947,853 B2
(45) Date of Patent: Apr. 17, 2018

(54) THERMOELECTRIC DEVICE

(71) Applicant: International Business Machines Corporation, Armonk, NY (US)

(72) Inventors: Heike E. Riel, Rueschlikon (CH); Volker Schmidt, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 7 days.

(21) Appl. No.: 14/496,729

(22) Filed: Sep. 25, 2014

(65) Prior Publication Data
US 2015/0171301 A1    Jun. 18, 2015

(30) Foreign Application Priority Data
Dec. 17, 2013    (GB) .................. 1322245.0

(51) Int. Cl.
*H01L 35/32*    (2006.01)

(52) U.S. Cl.
CPC .................. *H01L 35/32* (2013.01)

(58) Field of Classification Search
CPC .......................... H01L 35/00–35/34
USPC ................................ 136/200–242
See application file for complete search history.

(56) References Cited

U.S. PATENT DOCUMENTS

| | | | |
|---|---|---|---|
| 3,607,444 A * | 9/1971 | DeBucs | F25B 21/02 136/208 |
| 6,094,919 A | 8/2000 | Bhatia | |
| 6,121,539 A * | 9/2000 | Johnson | H01L 23/38 136/203 |
| 6,282,907 B1 | 9/2001 | Ghoshal | |
| 6,388,186 B1 * | 5/2002 | Nomura | G01J 5/12 136/224 |
| 2002/0092557 A1 | 7/2002 | Ghoshal | |
| 2005/0045702 A1* | 3/2005 | Freeman | B23K 1/0016 228/254 |
| 2006/0016248 A1* | 1/2006 | Walsh | H01L 35/22 73/40 |
| 2009/0007952 A1* | 1/2009 | Kondoh | H01L 35/32 136/203 |
| 2010/0124022 A1 | 5/2010 | Causevic | |

(Continued)

FOREIGN PATENT DOCUMENTS

JP    4019014 B2    12/2007
JP    2013528940 A    7/2013

(Continued)

OTHER PUBLICATIONS

A. Pettes, et al., "Optimized Thermoelectric Refrigeration in the Presence of Thermal Boundary Resistance," IEEE Transactions on Advanced Packaging, vol. 32, No. 2, May 2009, pp. 423-430.
IPO UK Search Report; Application No. GB1322245.0; Patents Act 1977: Search Report Under Section 17(5), dated Jun. 20, 2014, pp. 1-3.

(Continued)

*Primary Examiner* — Liesl C Baumann
(74) *Attorney, Agent, or Firm* — Mark G. Edwards (57) ABSTRACT

A thermoelectric device for transferring heat from a heat source to a heat sink includes at least one thermoelectric leg pair having a first leg including an n-type semiconductor material and a second leg including a p-type semiconductor material. The first leg and the second leg are electrically coupled in series. A resistive element electrically couples the first leg and the second leg between the heat source and the heat sink.

15 Claims, 6 Drawing Sheets

(56) References Cited

U.S. PATENT DOCUMENTS

| | | | |
|---|---|---|---|
| 2011/0048486 A1* | 3/2011 | Sensui | H01L 35/08 |
| | | | 136/203 |
| 2011/0048489 A1 | 3/2011 | Gabriel et al. | |
| 2011/0139203 A1* | 6/2011 | Yap | H01L 35/30 |
| | | | 136/205 |
| 2012/0067064 A1 | 3/2012 | Danenberg et al. | |
| 2012/0097206 A1* | 4/2012 | Sadaoka | H01L 35/22 |
| | | | 136/212 |
| 2013/0081663 A1 | 4/2013 | Yang et al. | |
| 2013/0104951 A1* | 5/2013 | Savelli | H01L 35/32 |
| | | | 136/203 |
| 2014/0041705 A1* | 2/2014 | Kang | H01L 31/02168 |
| | | | 136/206 |
| 2015/0207055 A1* | 7/2015 | Mabuchi | H01L 35/32 |
| | | | 136/203 |

FOREIGN PATENT DOCUMENTS

| | | |
|---|---|---|
| WO | 9615412 A2 | 5/1996 |
| WO | 2006019059 A1 | 2/2006 |
| WO | 2012140652 A1 | 10/2012 |
| WO | 2014026100 A2 | 2/2014 |

OTHER PUBLICATIONS

P.Y. Hou, et al., "Optimization of Microscale Thermoelectric Cooling (TEC) Element Dimensions for Hot Spot Cooling Applications," ICT, 2008, pp. 1-6.

"Decision to Grant a Patent" for patent titled "The thermoelectrical device and module for moving heat to a heat sink from a heat source," Patent Application No. 2014-213393, dated Apr. 12, 2016, translated Jun. 2, 2016, 6 pages.

* cited by examiner

THERMOELECTRIC DEVICE

FOREIGN PRIORITY

This application claims priority to Great Britain Patent Application No. 1322245.0, filed Dec. 17, 2013, and all the benefits accruing therefrom under 35 U.S.C. § 119, the contents of which in its entirety are herein incorporated by reference.

BACKGROUND

This disclosure generally relates to heat transfer devices, in particular to thermoelectric devices and modules for transferring heat from a heat source to a heat sink. More particularly, this disclosure relates to thermoelectric devices that can be coupled to objects to be heated or cooled.

Thermoelectric devices for cooling are used to transfer excess heat from electronic devices, such as sensors, active electro-optical components, infrared CCD chips and the like. As many electronic devices have low power dissipation, additional cooling means are desired. Electric cooling was first discovered by John Charles Peltier who observed that a current flowing through a junction between dissimilar conductors, such as n- or p-type semiconductors, can induce heat or cooling as a function of the current flow through the junction. This effect is called the Peltier or thermoelectric effect, in which temperature can be increased or lowered depending on the current direction through the junction.

Thermoelectric devices are often used as heat pumps placed between a heat source and a heat sink wherein the heat source can be an electric component and the heat sink sometimes is a surface plate or a convection heat sink. Conventional thermoelectric cooling devices often use multiple stages to stepwise cool down an object or transfer heat away from a heat source. Such multi-stage modules essentially consist of separate thermoelectric modules stacked on top of each other. This leads to additional space requirements and an increase in expenditure due to the plurality and complexity of thermoelectric components involved. It is generally desirable, however, to increase the efficiency of thermoelectric cooling modules.

SUMMARY

In one embodiment, a thermoelectric device for transferring heat from a heat source to a heat sink includes at least one thermoelectric leg pair having a first leg including an n-type semiconductor material and a second leg including a p-type semiconductor material, wherein the first leg and the second leg are electrically coupled in series; and a resistive element electrically coupling the first leg and the second leg between the heat source and the heat sink.

In another embodiment, a thermoelectric module includes at least one thermoelectric device, having at least one thermoelectric leg pair having a first leg including an n-type semiconductor material and a second leg including a p-type semiconductor material, wherein the first leg and the second leg are electrically coupled in series; and a resistive element electrically coupling the first leg and the second leg between the heat source and the heat sink, wherein the at least one thermoelectric leg pair is bonded between the heat source and the heat sink.

BRIEF DESCRIPTION OF THE SEVERAL VIEWS OF THE DRAWINGS

In the following, embodiments of thermoelectric device and modules are described with reference to the enclosed drawings.

Like or functionally like elements in the drawings have been allotted the same reference characters, if not otherwise indicated.

DETAILED DESCRIPTION

Embodiments of the present disclosure provide an improved thermoelectric device for transferring heat from a heat source to a heat sink. A thermoelectric device may, in particular, be suitable for implementing further thermoelectric modules or arrangements.

According to an embodiment of the invention a thermoelectric device for transferring heat from a heat source to a heat sink includes at least one thermoelectric leg pair having a first leg including an n-type semiconductor material, and a second leg including a p-type semiconductor material wherein the first leg and the second leg are electrically coupled in series; and a resistive element electrically coupling the first leg and the second leg between the heat source and the heat sink.

The two legs forming a pair can be, e.g., arranged in parallel to each other and placed between interfaces to a heat source and a heat sink, respectively. In operation of the thermoelectric device, an electric current may be injected through the first and the second leg, wherein at the junction between the p- and n-type semiconductor material the Peltier effect may be employed. As a result, there is a temperature gradient between the side of the leg pair facing to the heat source and the side of the leg pair facing to the heat sink. For example, the heat source can be an electronic device that needs to be cooled. The heat sink can be a dissipator, for example. The resistive element allows for an electric current between the first leg and the second leg in a region away or remote from the p-n junction.

In embodiments of the thermoelectric device, the first leg and the second leg are thermally coupled in parallel between the heat source and the heat sink. One can also contemplate an alternating n-type leg and p-type leg configuration wherein the legs are electrically coupled in series, however, in parallel with regard to heat transfer.

The at least one resistive element may be adapted to at least partially bypass an electric current through a junction between the first leg and the second leg. The resistive element may have a higher electrical resistance than the electrical coupling or connection between the two legs and/or the contacts for inserting a current used for the thermoelectric effect(s) at the junctions or material interfaces. For example, the bypass current is lower than the operational current through the circuit formed by the first leg, a metal layer or contact and the second leg.

Bypassing electrical current and thereby generating heating in regions different from the junction exhibiting the Peltier effect may render the thermoelectric device as to allow for a higher achievable temperature difference between the side of the legs facing to the heat sink and the side of the legs facing to the heat source. A resistive element allowing for a current close to the heat sink may lead to a concentration of the heat close to the heat sink. The resistive element can be, e.g., implemented to allow for a bypass current thereby creating a steeper temperature gradient along the first and the second leg in a region close to the heat sink. Desirably, heat created by the Peltier effect at a p-n junction is localized at the heat sink. Hence, in embodiments, the at least one resistive element is arranged between the first leg and the second leg such that by changing the current flow Joule heating of the legs is shifted or concentrated towards the side of the heat sink.

The resistive element may include a structural support element. For example, the resistive element itself or parts of it may render the device mechanically more robust. In embodiments, the resistive element comprises an at least partially rigid material and a cross-section of the first and/or the second leg varies along the direction from the heat source to the heat sink.

Geometrically, changing the thickness of a cross-section of the legs may lead to a modulation of the electric current through the legs. For example, by increasing the cross-section of the first and/or the second leg towards the heat sink leads, in the presence of a resistive element electrically connecting the first to the second leg, to a high current density and thereby a concentration of the heat at the sink.

The resistive element can include a material showing a temperature-dependent conductance. For example, the material for the heat resistive element has a conductance that increases as a function of temperature. As a result, more current runs through the resistive element between the two legs where a high temperature with respect to other regions occurs.

In embodiments of the thermoelectric device, the at least one resistive element comprises a material that is arranged between the first leg and the second leg and extends at least partially along the first leg and the second leg between a junction between the first leg and the second leg and a contact for inserting electric current into the first leg and/or the second leg.

For example, the resistive element may be implemented as a layer or filling between the legs. One may contemplate of semiconductor materials, metals, semimetals, or oxides but also of organic conducting materials, or combinations thereof, that may additionally show a temperature-dependent conductance.

In embodiments, the thermoelectric device comprises a plurality of resistive elements electrically coupling the first leg and the second leg between the heat source and the heat sink. One may contemplate resistive elements as bridging elements that partially couple the two legs with one another. The bridging elements may stabilize the two legs with respect to one another mechanically.

By using a plurality of resistive elements, the elements can be each adapted with respect to resistivity, conductivity or thermal properties. Hence, using a plurality of resistive elements allows for a better modulation of the current through legs and resistive elements and the heat distribution in the thermoelectric device.

In embodiments, each resistive element has a predetermined conductance such that the conductance of the resistive elements increases towards the side of the heat source. Also, in embodiments, the resistive elements extend between the first leg and the second leg, and the resistive elements are spaced with respect to one another along a longitudinal extension of the first leg and the second leg with predetermined distances. The distances can be adjusted to achieve a desired current and heat distribution in the device.

In embodiments, the resistive elements between the first leg and the second leg can have different cross-sections. By adjusting a cross-section, the electric and thermal properties of the resistive elements or bridging elements can be tuned.

In embodiments, the resistive elements between the first leg and the second leg can have different length/thickness. By adjusting a length/thickness, the electric and thermal properties of the resistive elements or bridging elements can be tuned.

In embodiments of a thermoelectric device, a plurality of thermoelectric leg pairs essentially arranged in parallel to each other are provided. For example, the p- and n-type legs are alternately connected electrically in series and thermally in parallel to each other between the heat sink and the heat source. The Peltier effect occurs when a voltage is applied to the n-type and p-type legs leading to a current flow through the serial electrical junctions between the n- and p-type regions. As a result, heat transfer across the n- and p-type legs in the parallel forward connection occurs. Further, bypass currents may run through the bridges or restive elements.

By increasing the number of leg pairs, more heat can be transferred. In embodiments of the thermal electric device, the plurality of thermoelectric leg pairs forms an array of legs arranged on a substrate. The substrate can lead to a better mechanical stability or robustness of the thermoelectric device.

According to an embodiment of another aspect of the invention, a thermoelectric module comprising at least one of the afore-mentioned thermoelectric devices is disclosed. According to an embodiment, at least one leg pair is bonded between the heat source and the heat sink. One can further contemplate of attaching several thermoelectric modules as a stack to achieve an even better heat transfer.

Certain embodiments of the presented thermoelectric device and the module may comprise individual or combined features or aspects as mentioned above or below with respect to exemplary embodiments.

In this disclosure, the term "heat source" refers to an element or object from which excess heat is to be transferred, e.g., through a thermoelectric device. The term "heat sink" refers to an element or object that may dissipate or capture heat. Generally, the heat source is cooled down through the thermoelectric device, and the heat sink is heated up. The thermoelectric device as disclosed can be considered a heat pump for transferring heat from the heat source to the heat sink. The "term cross section" is used to define the cross sectional area of an element. A "leg" is a structure having a longitudinal extension and a lateral extension. A leg can have a rod-like or column-like geometry. In some cases the longitudinal extension exceeds the lateral extension. However, other aspect ratios can be contemplated. In embodiments of the legs the longitudinal extension is in the direction from the heat source to the heat sink or vice versa. A leg may be assumed to carry an electric current and a thermal current essentially in parallel.

It is understood that the "resistive element" means allowing for a bypass current to flow between legs. The resistive element is functionally defined and can be implemented by a variety of structural means, e.g., a resistive material, and/or a particular geometry of the legs with respect to one another. A contact region between the legs due to a reduced lateral distance between the legs can also serve as a resistive element. The resistive element can be a discrete structural element or device but may also be a part or integrated into a leg.

The thermoelectric device employs the Peltier effect or thermoelectric effect. P-type and n-type doped semiconductor materials can be used as thermoelectric materials. For example, bismuth, antimony, bismuth telluride, bismuth selenide, bismuth antimonide, antimon telluride, lead telluride, lead selenide, lead antimonide, iron silicide, manganese silicide, cobalt silicide, magnesium silicide, chromium silicide, calcium manganese oxide or combinations thereof may be employed. One may contemplate of other semiconductor materials that show a thermoelectric effect.

Figure 1:
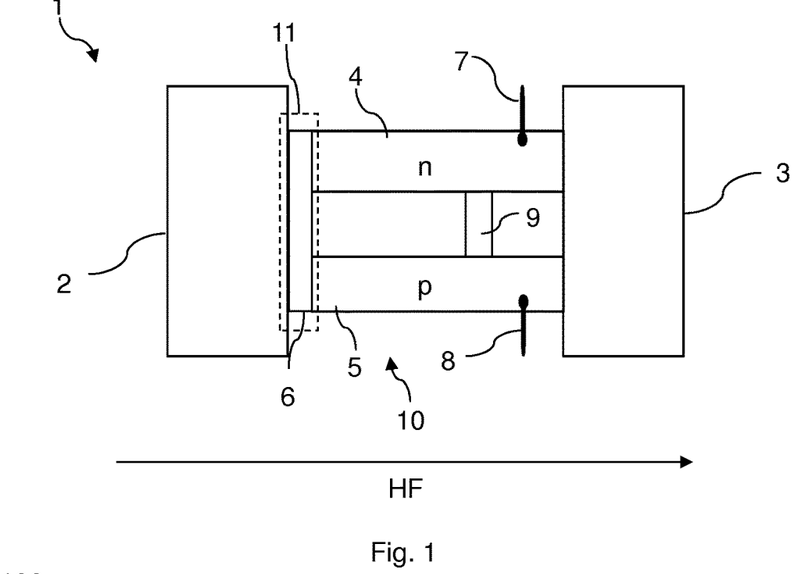
FIG. 1 shows a schematic diagram of a first embodiment of a thermoelectric device.

FIG. 1 shows a first embodiment of thermoelectric device 1. The thermoelectric device 1 is, for example, used for cooling an electric device that dissipates heat. In FIG. 1, a heat source 2 and a heat sink 3 are shown. The heat source 2 can be an electric component or another device that is supposed to be cooled. The heat sink 3 can be, for example, a dissipator or other cooling element.

The thermoelectric device 1 comprises a pair 10 of legs 4, 5. In the orientation of FIG. 1, the upper leg 4 is an n-type semiconductor and the lower leg 5 is a p-type semiconductor. The n- and p-type semiconductor materials of the legs 4, 5 are attached or electrically connected to each other through a metal layer 6 thereby effectively forming a p-n junction 11. The junction 11 faces towards the heat source 2. There is an electric contact 7 coupled to the first leg 4 and an electric contact 8 coupled to the second leg 5. The contacts allow for an electric current to be inserted through the legs 4, 5 in series, e.g., by applying an electrical voltage between the electric contacts 7 and 8.

The thermoelectric leg pair 10 including the two legs 5, 4 is thermally coupled in parallel between the heat source 2 and the heat sink 3 and electrically coupled in series. This allows for a heat transfer from left to right which is indicated by the arrow HF illustrating a heat flow from the heat source 2 to the heat sink 3. Apart from the p-n junction 11, a resistive element 9, for example a suitable semiconductor material, is placed between the two legs 4, 5. The resistive element 9 allows for a bypass current to flow between the two legs 4, 5 away from the junction 11 where the Peltier effect is used. The resistive element 9 is closer to the heat sink 3 than to the heat source 2.

By adding the resistive element 9, the current distribution through the legs and the path between the first contact 7, the first leg 4, the junction 11 or the metal coupling layer 6, the second leg 5 and the second contact 8 can be adjusted. For example, electric current runs through the bypass in terms of the resistive element 9 which leads to an enhanced Joule heating at the warm or hot side of the thermoelectric device 1. In comparison to a conventional thermoelectric device, electric bridges or resistive elements 9 allow for bypass currents. An increased temperature difference between the side facing to the heat source 2 and the side facing to the heat sink can be achieved. The performance of a thermoelectric device can be improved by shifting or concentrating current leading to Joule heating towards the hot side of the device.

Figure 2:
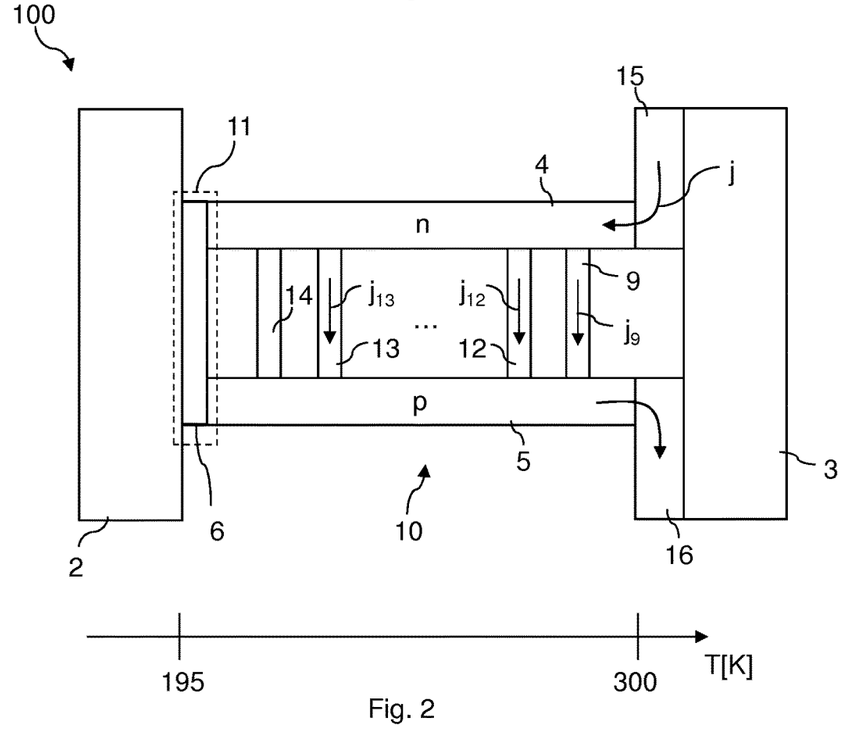
FIGS. 2, 3, 4, 5, 6, and 7 show schematic diagrams of further embodiments of thermoelectric devices.

FIG. 2 shows a second embodiment of a thermoelectric device 100. The thermoelectric device 100 is placed between a heat source 2 and a heat sink 3. A thermoelectric leg pair 10 has a first leg 4 and a second leg 5. In the section shown in FIG. 2, the two legs 4, 5, wherein the first leg comprises n-type and the second leg comprises p-type material, are coupled by a thin metal layer 6. Metal contact layers 15 and 16 are provided at the distal ends of the legs 4, 5 with respect to the junction 11.

Between the two legs 4 and 5, several resistive elements or bridges 9, 12, 13 and 14 are placed between the two legs 4, 5 along their longitudinal extension. The bridges or resistive elements 9, 12, 13, 14 allow for bypass currents $j_9$, $j_{12}$, $j_{13}$, $j_{14}$ to flow between the legs 4, 5. When operating the thermoelectric device 100, a current j is inserted, for example, into the upper or first leg 4 through the metal contact 15. One part of the current runs through the leg 4 towards the junction 11, enters the second leg 5 and exits the thermoelectric device 100 through the second metal contact 16. Additionally, bypass currents $j_9$, $j_{12}$, $j_{13}$, $j_{14}$ run through the bridges or resistive elements 9, 12, 13, 14 between the legs 4, 5. By distributing the bridges or resistive elements 9, 12, 13, 14 appropriately, the electric current density (and eventually the temperature distribution) in the thermoelectric device can be tuned.

Investigations of the applicant show that in a thermoelectric device 100 without resistive elements as shown in FIG. 2, a temperature difference of 68K can be obtained when a ZT value of the thermoelectric materials of 0.9 at 300K is assumed and a voltage of 0.17 V is applied between the contacts 15 and 16. However, including the resistive elements 9, 12, 13, 14 and applying a voltage of 0.26 V leads to a minimum temperature of 195K which is indicated by graph at the bottom of FIG. 2. Thus, the temperature difference achievable through a thermoelectric device 101 is enhanced. Model calculations were performed based on an n-type and p-type thermoelectric material having a conductivity $10^5 \times 1/(\Omega m)$, a thermal conductivity of 3 W/(mK) and a Seebeck coefficient of $3 \times 10^{-4}$ V/K for the p-type leg and a Seebeck coefficient of $-3 \times 10^{-4}$ V/K for the n-type leg.

The ZT value is a figure denoting the ability of a given material to efficiently produce thermoelectric power and is defined by:

$$ZT = \frac{\sigma S^2 T}{\lambda}$$

wherein S is the Seebeck coefficient, $\lambda$ is the thermal conductivity, $\sigma$ is the electrical conductivity, and T is the temperature.

Figure 3:
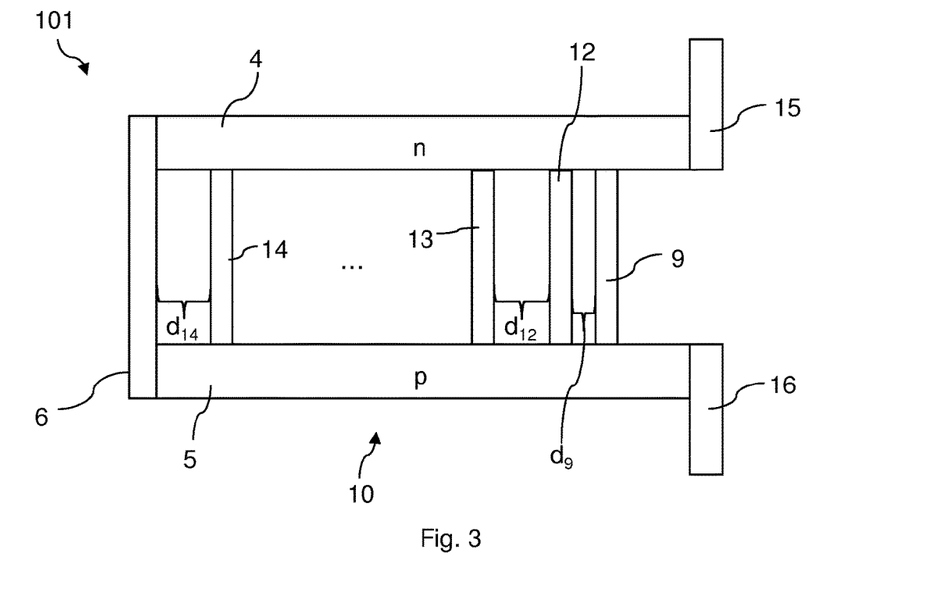

FIG. 3 shows another embodiment of a thermoelectric device similar to the one shown in FIG. 2. Again, two legs 4, 5 forming a pair 10 comprising a thermoelectric material are shown which are coupled to each other through a metal layer 6. Between the legs 4, 5, a plurality of bridges or resistive elements 9, 12, 13, 14 are placed. The resistive elements 9, 12, 13, 14 are only shown as examples. There may be more bridges than the drawn resistive elements in the device 101. The bridges or resistive elements 9, 12, 13, 14 are spaced with respect to each other by distances $d_9$, $d_{12}$, $d_{14}$. By adjusting the distances with respect to each other, the current distribution throughout the thermoelectric device 101 can be adjusted. For example, the distances $d_9$ and $d_{12}$ are smaller than the distance $d_{14}$ of the bridging element 14 or resistive element which is next to the junction realized by the metal contact 6.

It is contemplated that, in some embodiments, the distance between the bridges or resistive elements 9, 12 increases as a function of the distance from the heat sink facing side to the heat source facing side of the legs. This results in more electric current running through regions that are close to the heat sink, where the heating caused by the current can be more easily extracted.

Figure 4:
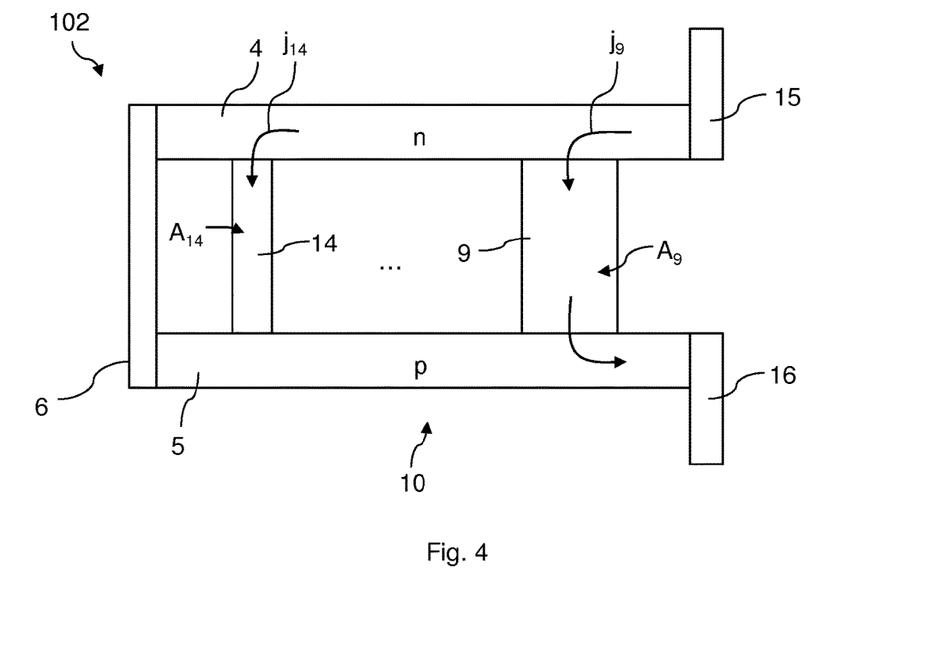

The current density may also be modified in the two legs 4, 5 by adjusting the material or the geometry of the bridges or resistive elements. Another embodiment is shown in FIG. 4 wherein the thermoelectric device 102 includes two legs 4, 5 which are coupled to each other in series by the metal layer 6 and that have electric contact layers 15, 16 for inserting electrical current. A plurality of bridges or resistive elements (only two of them are shown in FIG. 4) 9, 14 electrically couple the two legs 4, 5 of the thermoelectric leg pair 10. The bridges or resistive elements 9, 14 have a predetermined cross-section $A_{14}$, $A_9$. For example, the cross-section $A_9$ close to the heat sink (not shown) is larger than the cross-section $A_{14}$ distant from the heat sink. As a result, different bypass currents pass through the two bridges. The current $j_9$ is usually larger than the current $j_{14}$. Hence, Joule heating occurs in particular where the high bypass currents occur such that the overall temperature gradient is steeper towards the heat sink on the right-hand side.

Figure 5:
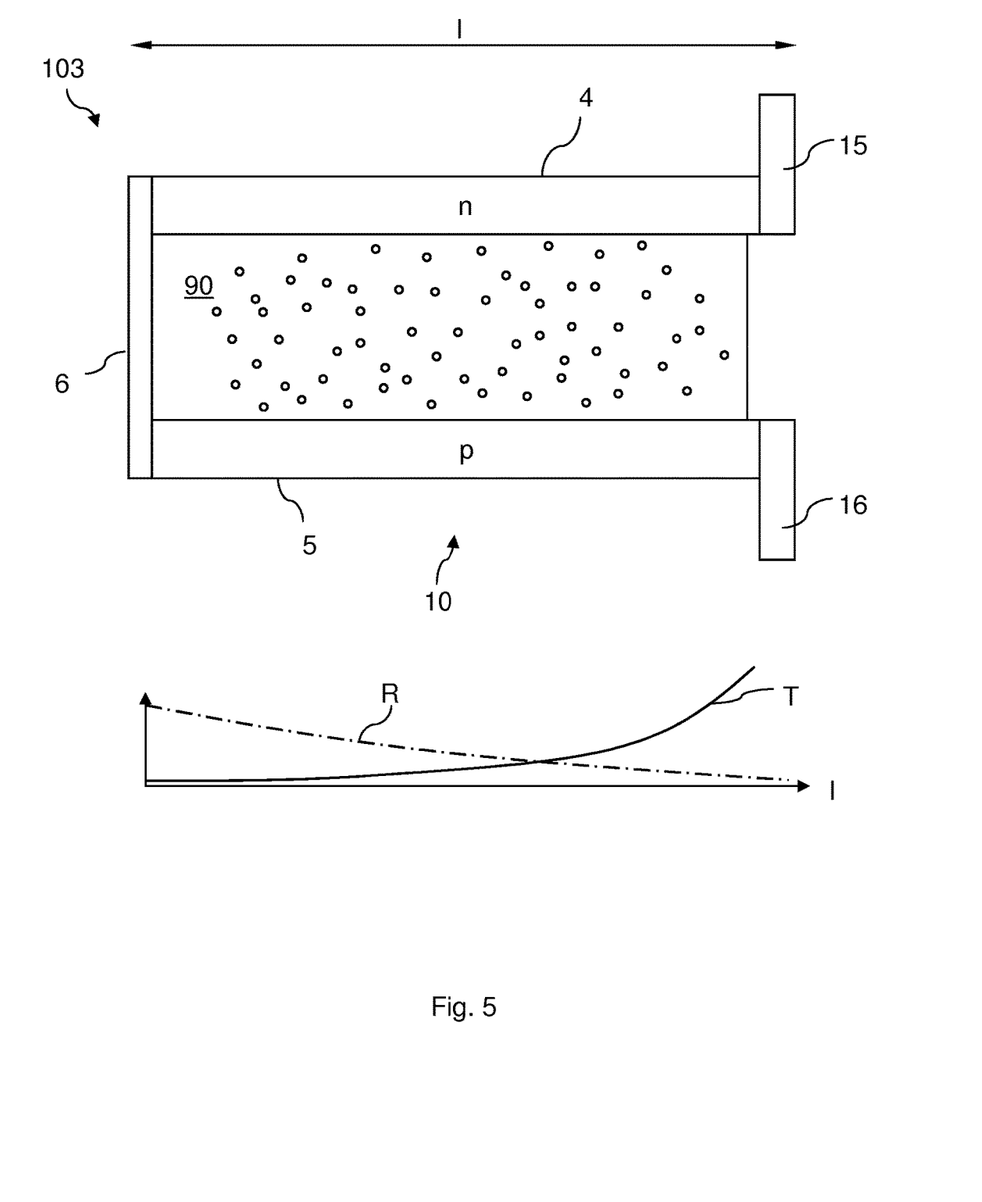

FIG. 5 shows yet another embodiment of the thermoelectric device 103. The device 103 comprises two thermoelectric legs 4, 5 that are coupled with each other through a metal 6. Two contact layers 15, 16 are shown. The length of the leg pair 10 is indicated by l. Instead of separate bridges or resistive elements, the region between the first and the second leg 4, 5 is filled with a resistive material 90. For example, the resistive material 90 allows for bypass currents between the two legs 4, 5. Preferably, the material used for the resistive filling 90 shows temperature-dependent properties, for example the conductance of the material for the resistive filling 90 increases with temperature. Conversely, the resistivity between the heat sink facing side and the heat source facing side of the resistive filling 90 increases towards the heat source. This is shown at the bottom of FIG. 5 wherein the solid curve T shows the temperature profile as a function of the length l, and the dash-dotted curve R refers to the resistance between the two legs 4, 5. For example, one may contemplate of organic materials that show a temperature-dependent resistivity or conductivity. As the temperature decreases from the heat sink facing side (right) to the heat source facing side (left), the bypass current density increases along with the temperature.

Figure 6:
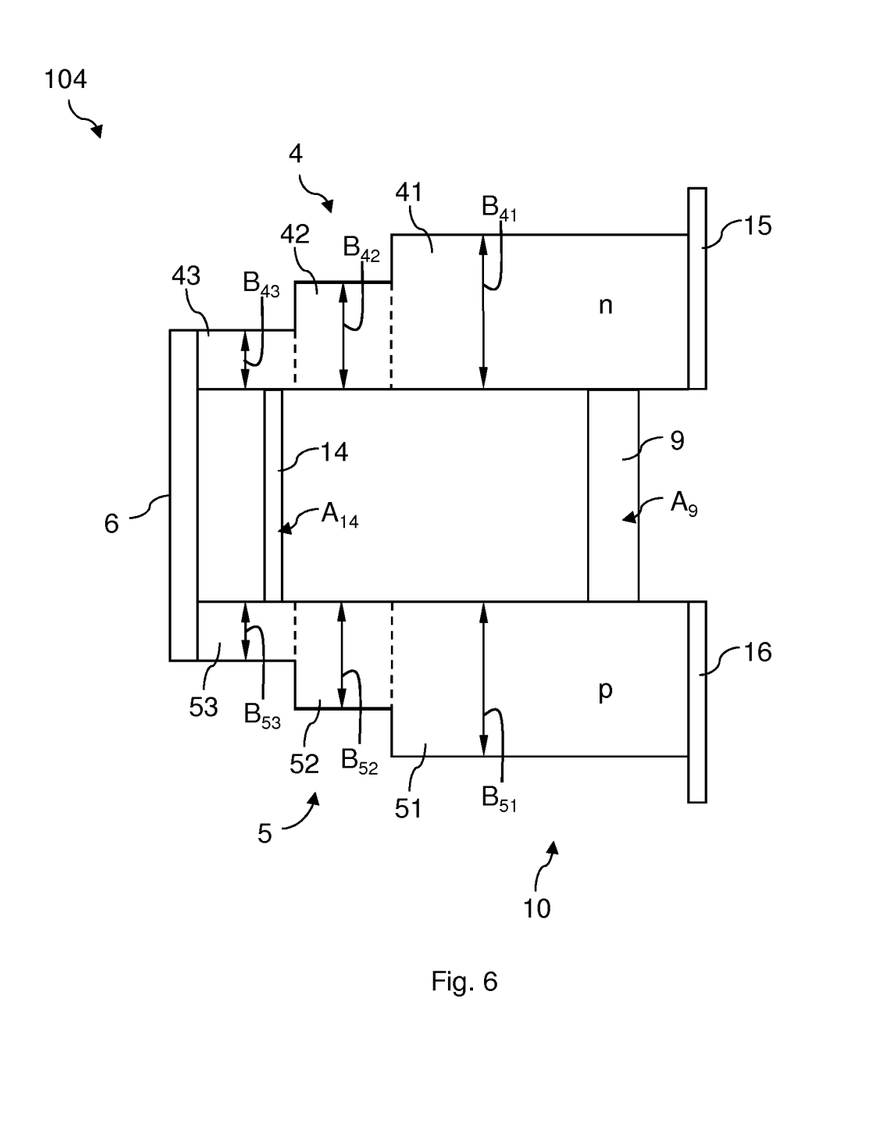

Another embodiment is shown in FIG. 6. The thermoelectric device 104 has a first upper leg 4 and a second lower leg 5. The thermoelectric legs 4, 5 of the pair 10 are coupled on the left by a metal layer 6. Between the legs 4, 5, resistive bridges or resistive elements 9, 14 are placed that allow for bypass currents to flow as described above. It will be seen that the resistive element 14 which is facing the left-hand side (towards the heat source) has a cross-section $A_{14}$, while the resistive element 9 facing towards the right-hand side (heat sink) has a cross-section $A_9$. $A_9$ is larger than $A_{14}$, thereby allowing for an increased bypass current as the cross sectional area translates into a conductance value.

Further, the cross-sections of the legs 4, 5 themselves change along their longitudinal extension. Each leg 4, 5 has three sections 41, 42, 43, 51, 52, 53, whereby each has a different cross-section which is indicated by reference numerals $B_{41}$, $B_{42}$, $B_{43}$, $B_{51}$, $B_{52}$ and $B_{53}$. Metal contacts 15 and 16 are provided for applying a voltage across the legs 4, 5. By scaling the cross-sections of the legs in the indicated fashion, Joule heating occurs predominantly at the heat sink side (right-hand side in FIG. 6). Hence, the entire heat transfer occurs more efficiently.

Instead of using a stepwise change of the leg cross-sections as shown in FIG. 6, the legs may have a continuous change in their cross-sectional area. This is indicated in the embodiment according to FIG. 7. The thermoelectric device 105 has two legs 54 and 55 coupled to each other through a metal layer 6 wherein a thickness of the legs increases along their length towards the heat sink (right-hand side). Together with an optional resistive element electrically coupling the legs 54 and 55, this measure leads, as explained above with respect to FIG. 6, to a spread in the temperature, thereby rendering the thermoelectric device 105 especially efficient.

Figure 7:
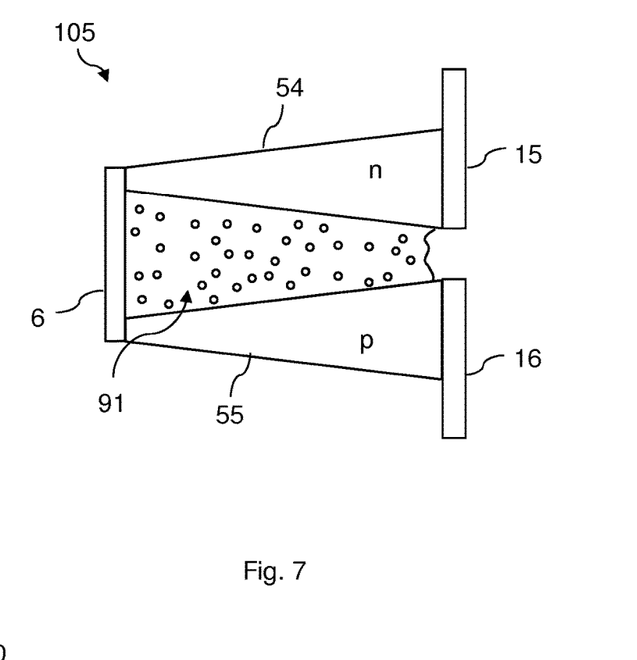

The resistive element or elements can be separate bridges and/or a filling 91 between the legs 54, 55. In FIG. 7 a filling 91 including a resistive materiel is shown as an example. The change in thickness of the legs 54, 55 along the longitudinal extension translates into a variation of the "thickness" of the resistive material of the filling 91 between the legs. As a result, the resistivity of the resistive element in terms of the filling 91 may decrease towards the heat sink (not shown, on the right-hand side in FIG. 7). The tapering of the legs 54, 55 indicated in the embodiment of FIG. 7 and the special resistance distribution can lead to an improved temperature transfer and distribution in the device 105.

Other geometries and cross sectional variations along the length of the legs can be contemplated. In embodiments the legs may be partially attached to each other in a region between the heat source and the heat sink to implement a bypass current through such a p-n junction.

Figure 8:
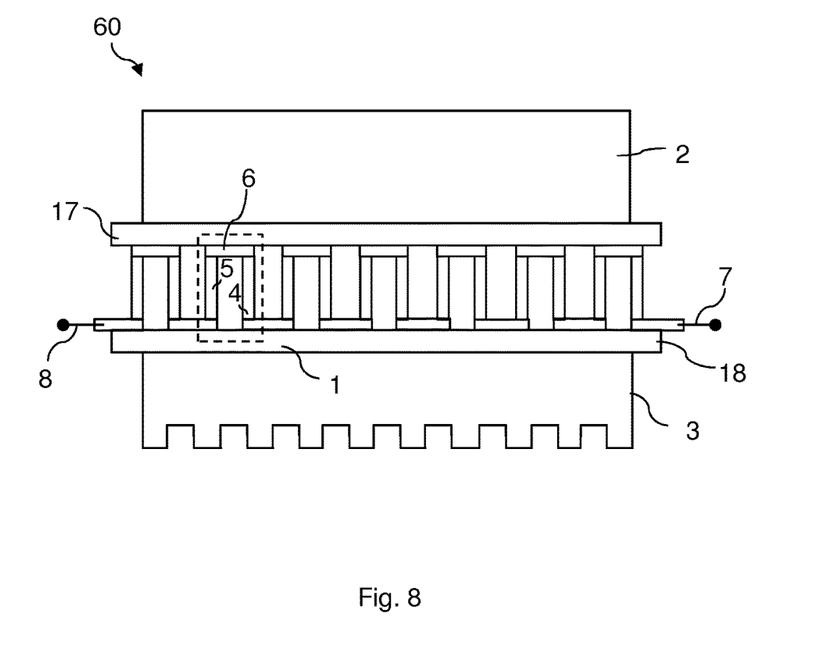
FIG. 8 shows a schematic diagram of an embodiment of a thermoelectric module.

FIG. 8 shows a schematic diagram of a thermoelectric module comprising a plurality of thermoelectric devices as depicted before. FIG. 8 shows a cross-section of a thermoelectric module 60. The thermoelectric module 60 is placed between a heat source 2 and a heat sink 3. The heat sink 3 has a dissipator, for example. A plurality of leg pairs indicated in the dashed box 1 are placed between two substrates 18 and 17. Substrates 18, 17 may guarantee a particular mechanic stiffness. In FIG. 8, only one leg pair 4, 5 with a metallic coupling 6 is indicated explicitly by reference signs. A respective leg, for example, can have a column shape. FIG. 8 shows a plurality of alternatingly coupled legs in series between the heat source facing side and the heat sink facing side. There are alternatingly n-type and p-type materials coupled in series. The legs are all coupled in series electrically, however in parallel thermally with respect to the interface with the heat sink and the heat source. Electrical contacts 7 and 8 are provided to insert a current into the thermoelectric module 60. The module can comprise any plurality of the before-mentioned embodiments of thermoelectric devices.

Figure 9:
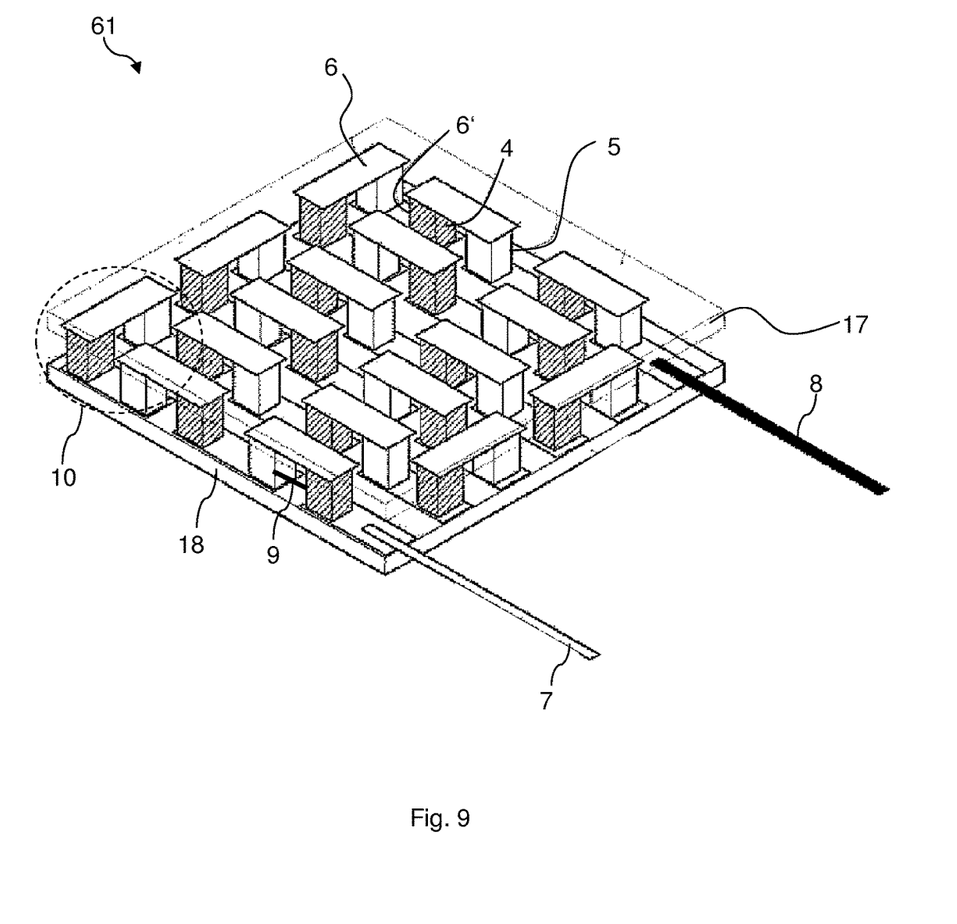
FIG. 9 shows a perspective view of a further embodiment of a thermoelectric module.

FIG. 9 shows a perspective view of a further embodiment of a thermoelectric module 61. Similar to the drawing of FIG. 8 a plurality of thermoelectric leg pairs 10 wherein at least a selection of the pairs 10 has a bridge or resistive element 9 allowing bypass currents to flow. Legs are arranged protruding from a substrate 18 in an array-like fashion. n-type legs 4 are illustrated with a hashed surface and the p-type legs 5 have a white surface. The upper substrate plate 17 is illustrated with a broken contour. Electrical contacts 7 and 8 are provided to insert a current into the thermoelectric module 61, and upper 6 and lower 6' metal layer contacts implements a serial connection of the legs.

The disclosed thermoelectric devices and modules may allow for an efficient heat transfer from a heat source to a heat sink. In particular, objects that need cooling such as electric chips, CCD chips or the like can be attached to such a thermoelectric module. Embodiments of thermoelectric devices and modules according to the invention require two substrates at most having the thermoelectric legs in between. This provides an advantage over conventional multi-stage thermoelectric modules that require several substrates to achieve the same or even less performance.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others.

LIST OF REFERENCE CHARACTERS 1 thermoelectric device
2 heat source
3 heat sink
4 n-type leg
5 p-type leg
6 metal layer
7, 8 contact
9 resistive element
10 leg pair
11 junction
12, 13, 14 resistive element
15, 16 metal layer
17, 18 substrate
41, 42, 43 n-type leg section
51, 52, 53 p-type leg section
44 n-type leg
54 p-type leg
60, 61 thermoelectric module
90, 91 resistive element
100-105 thermoelectric device
HF heat flow
j electric current
T temperature
R resistance
$A_i$, $B_i$ cross section
$d_i$ distance
l length

The invention claimed is:

1. A thermoelectric module for transferring heat from a heat source to a heat sink, comprising:
   a plurality of thermoelectric leg pairs, each thermoelectric leg pair of the plurality of thermoelectric leg pairs having a first end and a second end, wherein a first leg of each thermoelectric leg pair comprises an n-type semiconductor material and a second leg of each thermoelectric leg pair comprises a p-type semiconductor material;
   a plurality of metal elements; and
   a plurality of first electrical contacts and a plurality of second electrical contacts;
   wherein the first leg and the second leg of each thermoelectric leg pair are electrically coupled in series at the first end by a respective one of the plurality of metal elements;
   wherein each first leg of the plurality of thermoelectric leg pairs is coupled at the second end to a respective one of the plurality of first electrical contacts, and each second leg of the plurality of thermoelectric leg pairs is coupled at the second end to a respective one of the plurality of second electrical contacts;
   wherein each thermoelectric leg pair comprises a first resistive element to electrically couple the first leg and the second leg at a first junction between the first end and the second end, wherein
       each first resistive element is spaced apart from the first end, the second end, the respective one metal element, the respective one first electrical contact and the respective one second electrical contact, and
       each first junction is located at a first distance from the first end and is located at a second distance from the second end, wherein the second distance is less than the first distance.

2. The thermoelectric module of claim 1, wherein the first leg and the second leg of each thermoelectric leg pair are thermally coupled in parallel between the heat source and the heat sink.

3. The thermoelectric module of claim 1, wherein the first resistive element of each thermoelectric leg pair at least partially bypasses an electric current through the first junction between the first leg and the second leg.

4. The thermoelectric module of claim 1, wherein the first resistive element of each thermoelectric leg pair is arranged between the first leg and the second leg such that a Joule heating of the legs is concentrated towards a side of the heat sink.

5. The thermoelectric module of claim 1, wherein a cross section of the first leg or the second leg of each thermoelectric leg pair varies along a direction from the heat source to the heat sink.

6. The thermoelectric module of claim 1, wherein each thermoelectric leg pair further comprises a second resistive element adapted to electrically couple the first leg and the second leg at a second junction between the first end and the second end.

7. The thermoelectric module of claim 6, wherein the first resistive element and the second resistive element of each thermoelectric leg pair extend between the first leg and the second leg and wherein the first resistive element and the second resistive element of each thermoelectric leg pair are spaced with respect to one another along a longitudinal extension of the first leg and the second leg with a predetermined distance.

8. The thermoelectric module of claim 6, wherein the first resistive element and the second resistive element of each thermoelectric leg pair extend between the first leg and the second leg, and wherein the first resistive element and the second resistive element of each thermoelectric leg pair have different cross sections.

9. The thermoelectric module of claim 6, wherein the plurality of thermoelectric leg pairs is arranged in parallel to each other.

10. The thermoelectric module of claim 6, wherein the plurality of thermoelectric leg pairs is electrically coupled in series.

11. The thermoelectric module of claim 6, wherein the plurality of thermoelectric leg pairs is arranged on a substrate.

12. The thermoelectric module of claim 1, wherein
    the plurality of thermoelectric leg pairs is bonded between the heat source and the heat sink.

13. The thermoelectric module of claim 12, wherein the first resistive element of each thermoelectric leg pair is arranged between the first leg and the second leg such that a Joule heating of the legs is concentrated towards a side of the heat sink.

14. The thermoelectric module of claim 12, wherein a cross section of the first leg or the second leg of each thermoelectric leg pair varies along a direction from the heat source to the heat sink.

15. The thermoelectric module of claim 1, wherein a bypass current flowing through the first resistive element of each thermoelectric leg pair is lower than an operational current flowing through a circuit formed by the first leg, the metal element, and the second leg.

* * * * *